United States Patent [19]
Nagaishi et al.

[11] Patent Number: 6,037,313
[45] Date of Patent: Mar. 14, 2000

[54] METHOD AND APPARATUS FOR DEPOSITING SUPERCONDUCTING LAYER ONTO THE SUBSTRATE SURFACE VIA OFF-AXIS LASER ABLATION

[75] Inventors: Tatsuoki Nagaishi; Hideo Itozaki, both of Itami, Japan

[73] Assignee: Sumitomo Electric Industries, Ltd., Osaka, Japan

[21] Appl. No.: 08/527,212

[22] Filed: Sep. 12, 1995

[30] Foreign Application Priority Data

Sep. 16, 1994 [JP] Japan .................................... 6-248499
Sep. 16, 1994 [JP] Japan .................................... 6-248501

[51] Int. Cl.$^7$ .................................................. C30B 23/08
[52] U.S. Cl. ........................... 505/474; 505/475; 505/476; 505/731; 505/732; 204/298.02; 204/298.12; 204/298.13
[58] Field of Search ..................................... 505/731, 732, 505/474, 475, 476; 204/298.23, 298.12, 298.02

[56] References Cited

U.S. PATENT DOCUMENTS

| | | | |
|---|---|---|---|
| 5,126,318 | 6/1992 | Gavaler et al. .......................... | 505/475 |
| 5,206,213 | 4/1993 | Cuomo et al. .......................... | 505/475 |
| 5,244,873 | 9/1993 | Hattori et al. .......................... | 505/475 |
| 5,252,547 | 10/1993 | Itozaki et al. .......................... | 505/475 |

FOREIGN PATENT DOCUMENTS

| | | | |
|---|---|---|---|
| 5-213699 | 8/1993 | Japan .................................... | 505/475 |

OTHER PUBLICATIONS

Patent Abstracts of Japan No. JP1177367, published Oct. 16, 1989.
Muenchausen et al, "Effects of beam parameters on excimer laser deposition of $YBa_2Cu_3O_{7-\delta}$" 320 Applied Physics Letters 56 (1990) Feb. 5, No. 6, New York, U.S.
Miura et al, "Structure and superconducting properties of $Y_1Ba_2Cu_3O_{7-\delta}$ films prepared by transversely excited atmospheric pressure CO2 pulsed laser evaporation" Applied Physics Letters, 52 (1988) Mar. 21, No. 12, New York, U.S.
Holzapfel et al., "Off–axis laser deposition of $YBa_2Cu_3O_{7-\delta}$thin films" Applied Physics Letters, Dec. 28, 1992, vol. 61, No. 26, pp. 3178–3180.
Japanese Patent Abstract Publication No. JP3174307.
Japanese Patent Abstract Publication No. JP6219893.
Japanese Patent Abstract Publication No. JP3174306.
Japanese Patent Abstract Publication No. JP6219894.

*Primary Examiner*—Robert Kunemund
*Attorney, Agent, or Firm*—Smith, Gambrell & Russell; Beveridge, DeGrandi, Weilacher & Young Intellectual Property Group

[57] ABSTRACT

The method for forming superconducting films of complex oxide compounds in a process chamber according to the present invention includes the steps of:

(a) placing a substrate near a target in a chamber so that the substrate is positioned to be generally perpendicular to a surface of the target, the target comprising a target material of complex oxide compounds; and (b) irradiating a laser beam to the surface of the target to vaporize or sublime the target material forming over the target a flame-shaped plume having on axis generally perpendicular to the surface of the target so that the target material is deposited onto a surface of the substrate, the surface of the substrate maintaining the position to be generally perpendicular to the surface of the target and being generally parallel to the axis of the plume, wherein the target rotates on an axis perpendicular to the surface of the target and the substrate rotates on an axis perpendicular to the surface of the substrate (off-axis geometry), and wherein the laser beam scans the surface of the target. The chamber pressure $P_c$ for the off-axis geometry laser ablation should be $0.8 \text{ Torr} \leq P_C \leq 1.5$ Torr for $Y_1Ba_2Cu_3O_{7-x}$ film.

19 Claims, 13 Drawing Sheets

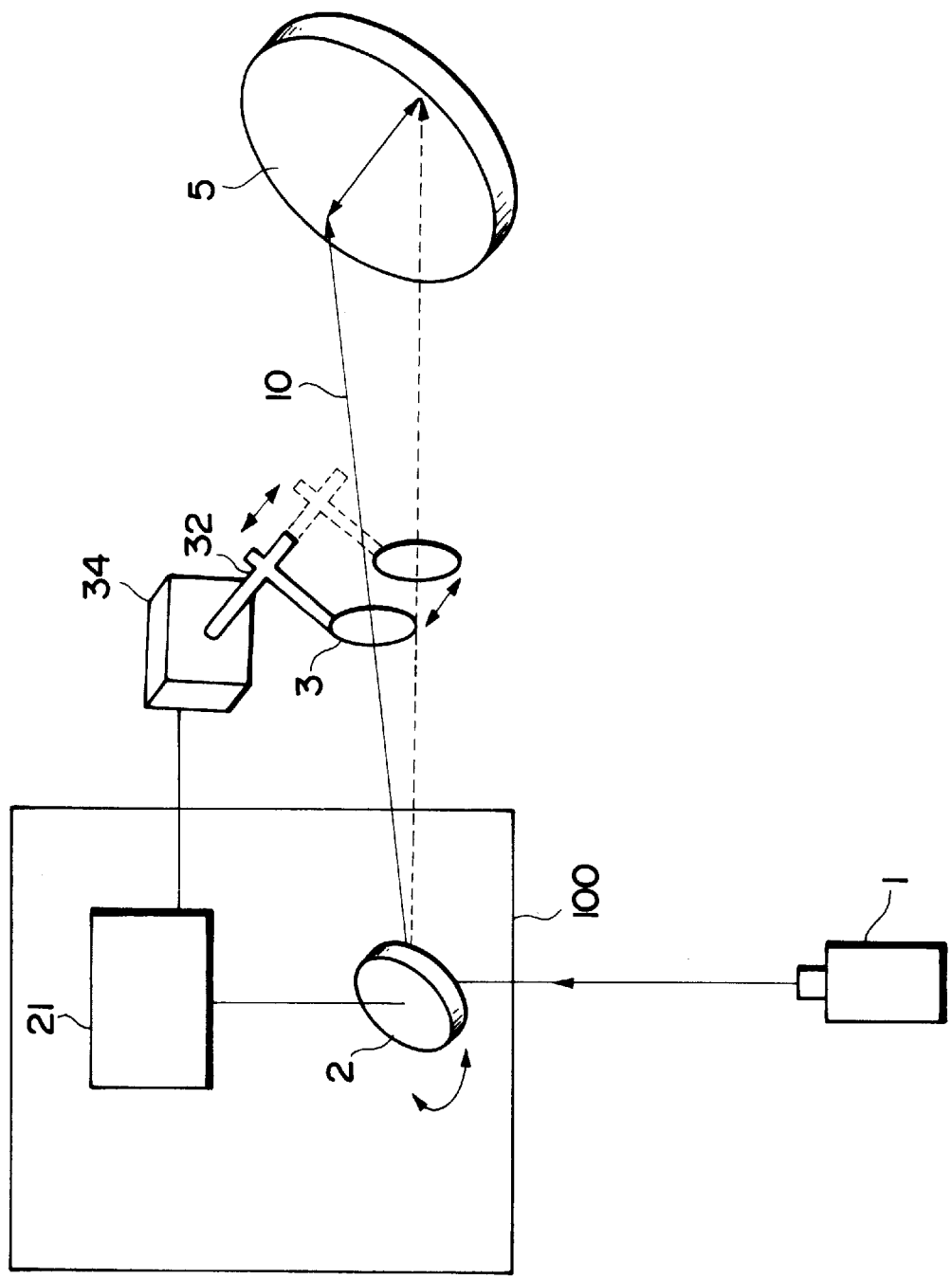

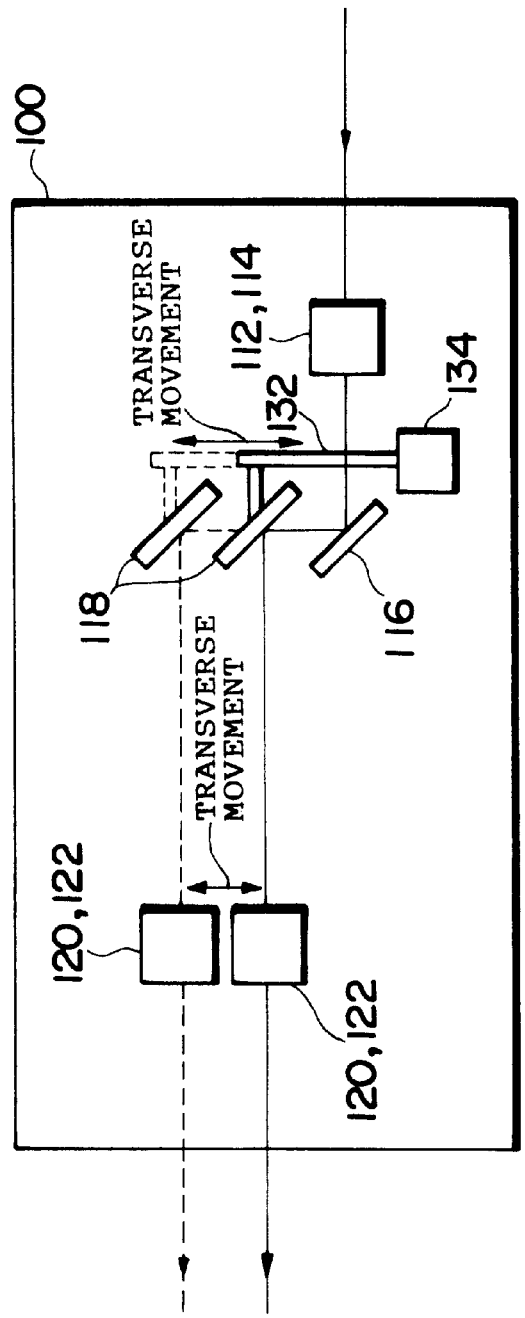

Fig.2A
Fig.2B
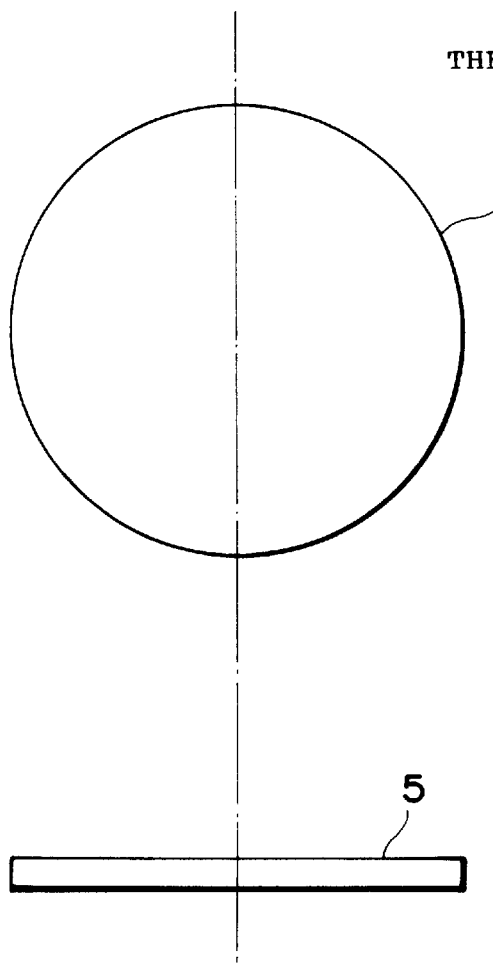
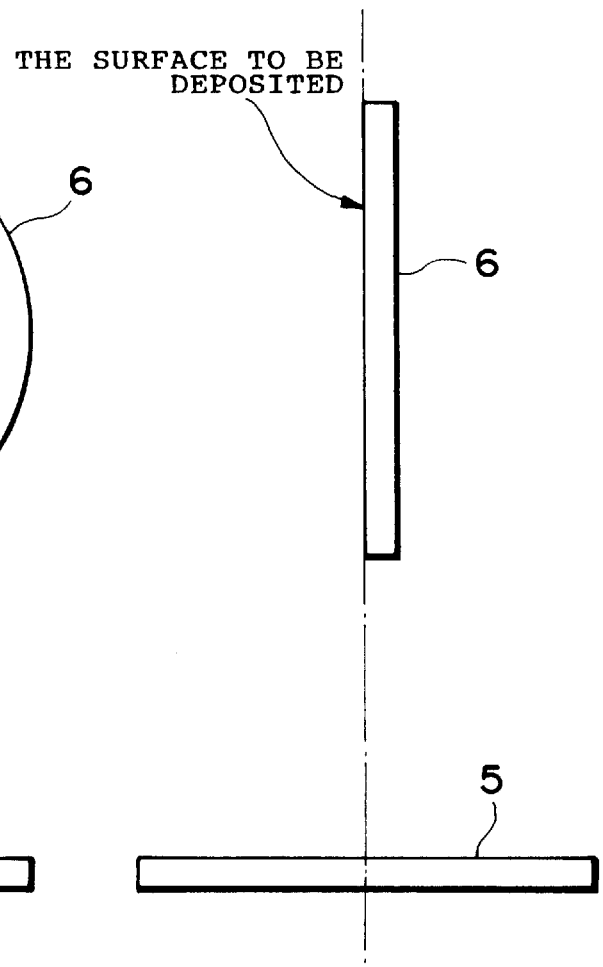

:nm

:K

:nm

:K

METHOD AND APPARATUS FOR DEPOSITING SUPERCONDUCTING LAYER ONTO THE SUBSTRATE SURFACE VIA OFF-AXIS LASER ABLATION

BACKGROUND OF THE INVENTION

1. Field of the Invention

The present invention is directed to a method and an apparatus for forming a superconducting layer onto the large substrate surface. The present invention is, in particular, suitable for depositing a superconducting layer which includes complex superconducting oxides.

2. Related Background Art

Laser ablation is one of the most suitable deposition process for obtaining excellent quality of thin films on substrate. Laser ablation process has advantages, such as excellent stoichiometric stability of deposited film, when the processes are used for the films of the superconducting oxide compounds. Laser ablation also has another advantage that it does not require any electromagnetic fields, which may possibly affect the charged particles contained in the deposited film. Therefore, laser ablation is expected to be employed as deposition process for most promising near-term devices.

Complex oxide superconducting compounds such as $Y_1Ba_2Cu_3O_{7-x}$ are the multi-elements complex oxide materials. The stoichiometric stability is very important for forming films of the complex oxide superconducting compounds, since a slight stoichiometric deviation causes a serious deterioration of the superconduction characteristics of the formed films. As mentioned above, laser ablation is suitable for depositing thin films of the complex oxide superconducting compounds with excellent stoichiometric stability. Thus, studies have been made to obtain excellent complex oxide superconducting films having excellent superconduction characteristics. For example, Japanese Patent No. 53818/04 (Kokoku Hei 04-53818) discloses a processing method for forming a Y-Ba-Cu-O complex oxide superconducting film on a copper sheet, by irradiating $CO_2$ laser beam onto a cylindrical shaped sintered Y-Ba-Cu-O target, under the condition of the total pressure of $1 \times 10^{-4}$–1 Torr and the $O_2$ partial pressure of $5 \times 10^{-5}$–1 Torr.

Linzen et al. (Second International Conference on Macroscopic Quantum Phenomena, Smolenice Castle, Czechoslovakia, Aug. 31 Sep. 4, 1992) discloses experiments of forming Y-Ba-Cu-O superconducting films via laser ablation using KrF excimer laser under the condition of various oxygen ($O_2$) partial pressures which varied from 10 Pa (about 75 mTorr) to 150 Pa (about 1.13 Torr). Linzen et al. further discloses a study concerning the influence of the oxygen partial pressure upon the surface condition and the superconduction characteristics of the formed Y-Ba-Cu-O films. Krebe et al. (J. Appl. Phys. 69(4), pp.2405–2409, February 1991) discloses experiments of forming Y-Ba-Cu-O superconducting films via laser ablation under the condition of the oxygen partial pressure ranging from 0.008 mbar (about 6 mTorr) to 2 mbar (1.5 Torr). Either Linzen et al. and Krebs et al. points out that the surface condition and the superconduction characteristics of the resultant Y-Ba-Cu-O films become worse when the oxygen partial pressure is in excess of 1 Torr. Another reference (Reference No. OQD-92-53, "Shadanhojin Denki Gakkai, Hirari Ryosi Debaisu Kenkyukai Shiryo (Japan Electrical Society, Photon and Quantum Devices Study meeting Proceedings)", pp.69–77, Oct. 28, 1992.) discloses a method for forming Y-Ba-Cu-O superconducting films with high quality via laser ablation using excimer laser.

Other studies concerning laser ablation have been also made by, for example, Song et al. (Appl. Phys. Lett. 63(24), pp.3370–3372, December 1993), Foltyn et al. (Appl. Phys. Lett 59(11), pp.1374–1376, September 1991) and J. A. Greer and H. J. VanHook (SPIE Proceedings, vol. 137, November 1990). In particular, Greer et al. discloses a method for producing thin films of a variety of oxide compounds over large areas.

The deposition process by laser ablation is typically carried out in the process chamber which is capable of being highly evacuated, and any gas can be introduced into the process chamber, as described in the above reference. In the operation via laser ablation, a substrate and a target are placed in the chamber, and laser beam is introduced into the process chamber from the external laser beam source to strike the target surface. The heated target material sublimes, and is deposited onto the substrate surface.

The deposited substrate via conventional laser ablation generally includes undesired particles on the deposited surface. Thus, it is difficult to achieve sufficient smoothness of the deposited surface of the substrate by the conventional laser ablation. Since the smoothness of the film surface contributes to the uniformity of performances and characteristics of the deposited films, it is difficult to form sufficient superconducting film having uniform characteristics via conventional laser ablation method.

The off-axis laser deposition method has recently been proposed, for decreasing undesired particles on the deposited films. For example, Holzapfel et al. discloses an off-axis laser deposition of $YBa_2Cu_3O_{7-x}$ thin films (Appl. Phys. Lett., vol. 61, No. 26, pp. 3178–3180, Dec. 28, 1995).

Holzapfel et al. carried out their off-axis laser ablation deposition under the chamber pressure of about 0.4 mbar (about 0.3 Torr). However, the quality of the film deposited under such a chamber pressure was not generally acceptable for superconducting elements.

Another problem of the laser ablation is that the available deposition surface area is considerably small, so that forming superconducting material films onto large substrate is difficult.

Therefore, it is desirable to provide a laser ablation method which presents an excellent film quality.

It is also desirable to provide a laser ablation method which is used for forming films onto the large substrate with a uniform film quality.

SUMMARY OF THE INVENTION

The present invention satisfies these needs.

The method for forming superconducting films of complex oxide compounds in a process chamber according to the present invention comprises the steps of:

(a) placing a substrate near a target in a chamber so that the substrate is positioned to be generally perpendicular to a surface of target, the target comprising a target material of complex oxide compounds; and (b) irradiating a laser beam to the surface of the target to vaporize or sublime the target material forming over the target a flame-shaped plume having an axis generally perpendicular to the surface of the target so that the target material is deposited onto a surface of the substrate, the surface of the substrate maintaining the position to be generally perpendicular to the surface of the target and being generally parallel to the axis of the plume, wherein the target rotates on an axis perpendicular to the surface of the target and the substrate rotates on an axis perpendicular to the surface of the substrate, and wherein the laser beam scans the surface of the target.

The laser beam scanning may be accomplished by a mirror scanner which comprises a mirror capable of oscillating or swinging so that the path of the laser beam oscillates, wherein the laser beam which strikes said target linearly traverses between one position near an edge and another position near the opposite edge. The laser beam may traverse along a path in the surface of the target of more than ½ of the representative length of the target.

The method for forming superconducting films of $Y_1Ba_2Cu_2O_{7-x}$ in a process chamber according to the present invention comprises the steps of:

(a) placing a $Y_1Ba_2Cu_3O_{7-x}$ target in a chamber;

(b) placing a substrate near the $Y_1Ba_2Cu_3O_{7-x}$ target in the chamber so that the substrate is positioned to be generally perpendicular to a surface of the target, the target comprising a target material of $Y_1Ba_2Cu_3O_{7-x}$; and (c) irradiating a laser beam to the surface of the target to vaporize or sublime the target material forming over the target a flame-shaped plume having an axis generally perpendicular to the surface of the target so that the target material is deposited onto a surface of the substrate, the surface of the substrate maintaining the position to be generally perpendicular to the surface of the target and being generally parallel to the axis of the plume, wherein the pressure in the chamber $P_c$ is;

$$0.8 \text{ Torr} \leq P_c \leq 1.5 \text{ Torr}.$$

The chamber pressure $P_c$ should be 0.15 Torr to 0.3 Torr for depositing $SrTiO_3$ film, and $P_c$ should be 0.03 Torr to 0.07 Torr for depositing $CeO_2$ film.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

The present invention will be more fully understood from the detailed description given hereinbelow and the accompanying drawings, which are given by way of illustration only and are not to be considered as limiting the present invention.

BRIEF DESCRIPTION OF THE DRAWINGS

These and other features, aspects, and advantages of the present invention will become better understood with reference to the following description, appended claims, and accompanying drawings, where:

FIG. 1C is a cross-sectional, side schematic view of a mirror scanner 100 of the processing apparatus shown in FIG. 1A, which consists of a mirror capable of oscillating or swinging. FIG. 1C illustrates oscillating of the laser beam by the mirror scanner;

FIG. 1D is a cross-sectional, plan schematic view of another preferable type of mirror scanner 100, which consists of six mirrors. FIG. 1D illustrates synchronistical movements of the mirrors;

FIG. 2A shows a front view of a example of the off-axis geometry;

FIG. 2B shows a side view of a example of the off-axis geometry;

DESCRIPTION OF THE PREFERRED EMBODIMENTS (Processing apparatus)

With reference to FIGS. 1A, 1B, 1C and 1D, we will now describe preferable versions of a substrate processing apparatus suitable for the present invention.

Figure 1A:
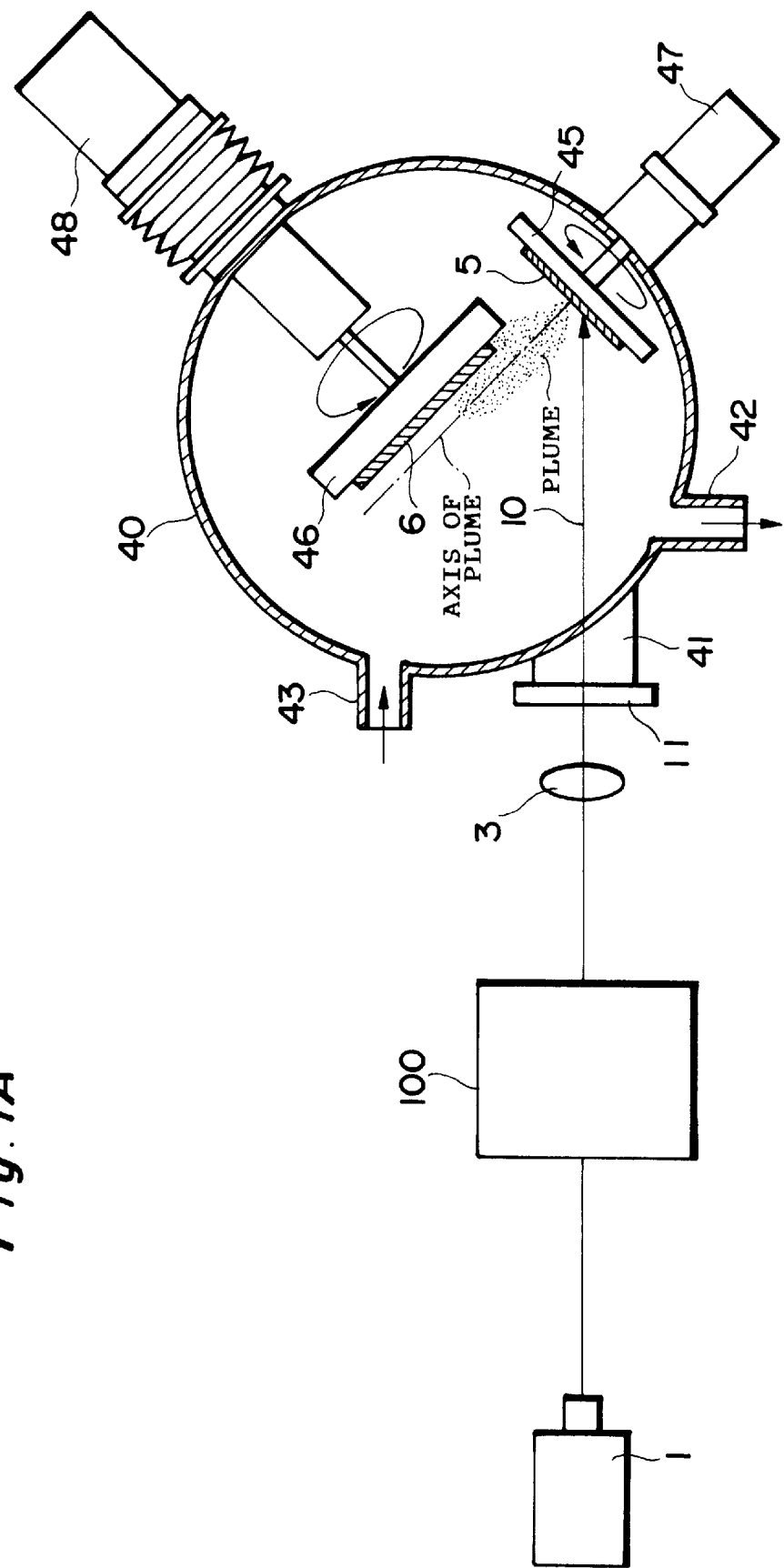
FIG. 1A is a cross-sectional, side schematic view of a processing apparatus according to the present invention, illustrating a laser ablation chamber for off-axis deposition.

Referring to the FIG. 1A, the processing apparatus comprises a laser beam source 1 and a vacuum chamber 40. Chamber 40 has a gas inlet 43 through which the process gases are introduced into chamber 40, and a gas outlet 42 through which consumed gases are exhausted. The pressure and the atmosphere in chamber 40 is variable. Chamber 40 includes a target holder 45 which supports a target 5, and a substrate holder 46 supporting a substrate 6. Laser beam source 1 is an KrF excimer laser having wavelength of 248 nm. Laser beam source 1 includes an attenuator.

Target holder 45 is supported by rotor 47, so that target 5 and target holder 45 are capable of rotating as illustrated in FIG. 1A. Substrate 6 is also capable of rotating by means of rotor 48.

Target holder 45 in the chamber 40 is disposed in a position so that a exposed surface of the target 5 is normal to the surface of the substrate 6. This configuration is referred as "off-axis geometry".

The laser ablation apparatus further has an optical path system from laser beam source 1 to target 5. Chamber 40 has an entrance window 41, which forms a part of the optical path system. The optical path system shown in FIG. 1A consists of laser beam source 1, a mirror scanner 100, a lens 3 and an entrance window 41.

(Optical path for laser ablation apparatus)

Figure 1B:
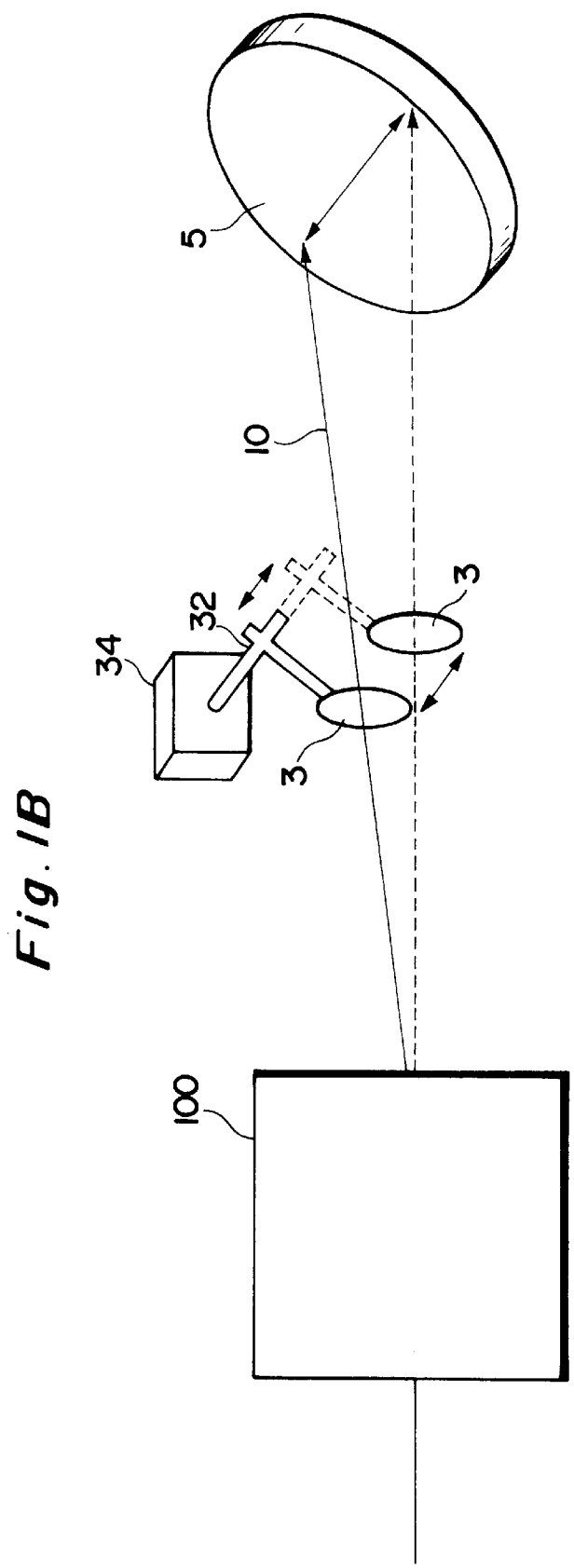
FIG. 1B is a perspective schematic view of the laser beam scanning system of the processing apparatus.

FIG. 1B illustrates laser beam scanning by the mirror scanner 100 and corresponding movements of lens 3. FIG. 1C shows a schematic view of a preferred version of mirror scanner 100 of the processing apparatus shown in FIG. 1A, which comprises a mirror 2 and a controller 21. FIG. 1C illustrates oscillating movements or swinging movements of mirror 2 for making linear scanning of the laser beam on target 5.

Mirror 2 is capable of oscillating or swinging so that the path of the laser beam oscillates as shown by solid line 10 and dotted lie in FIG. 1C, and laser beam which strikes target 5 linearly traverses between a position near one edge of target 5 and another position near the opposite edge, as shown in FIG. 1C. Controller 21 controls the oscillating movements or swinging movements of mirror 2. Controller 21 also controls the movement of lens 3, as detailed below.

It is preferable for laser beam to traverse along the path in the surface of the target of more than ½ of the "representative length" of the target, for the purpose of achieving uniform deposition onto substrate and uniform consumption of the target. By representative length it is meant to be the length (m) which characterizes the size of the target. For example, the representative length may be the diameter of the target when the target is disc-shaped. Or the representative length of the square plate target may be the diagonal line of the square. It is more preferable for laser beam to traverse more than 80% of the representative length of the target, for highly uniform consumption across the target.

As shown in FIGS. 1B and 1C, lens 3 for focusing laser beam, which is disposed between mirror scanner 100 and target 5 and supported by bar 32 connecting to servomotor 34, is capable of moving corresponding to laser beam scanning by mirror scanner 100 (i.e., by oscillation of mirror 2). The movements of lens 3 is given by a servomotor 34 and controlled by controller 21 to accomplish the movements corresponding to the scanning of laser beam.

The movement of lens 3 which corresponds to the oscillation of the optical path by mirror scanner 100 is determined as follows. Lens 3 itself moves two-dimensionally by the servomotor so that "the reduction rate on target 5" b/a (−) should be constant, where an optical path length "a" (mm) is a length between laser beam source 1 and lens 3, and an optical path length b (mm) is a length between lens 3 and target 5. However, linear movement of lens 3 could be enough to have the reduction rate b/a be substantially constant, when the optical length "a" between laser beam source 1 and lens 3 are sufficiently large. Such a configuration of laser beam source 1 and lens 3 provides a benefit that the complex servomotor system for providing two-dimensional movements can be avoided, and more simple servomotor system can be employed for moving lens 3.

The focal length "f" of lens 3 should be selected so that the relationship of "f" with "a" and "b" is;

$$1/f = 1/a + 1/b \qquad \text{eq. (1).}$$

Therefore, mirror scanner 100 and lens 3, along with rotating target 5, allow the uniform deposition of the film. This also allows the target material consumption to be uniform across the entire target surface. The laser beam can be controlled to be uniformly incident across the target surface, as shown in FIG. 1B.

The scanning rate of traversing velocity of striking laser beam on the target surface may vary depending on the striking position on the target surface so that the uniform deposition over the large area and the uniform consumption of the target is achieved. It is preferable that the scanning rate is controlled to be relatively higher around the center of the target, and relatively lower near the edge of the target. Alternately, the scanning may make a temporary stop at a predetermined position on the target so that the uniform deposition over the large area is achieved as well as uniform target consumption.

Mirror scanner 100 may be another type of scanner with another constitution. For example, mirror scanner may comprise a plurality of mirrors which synchronistically move.

FIG. 1D is a cross sectional, plan schematic view of another preferred version of mirror scanner 100, which comprises a plurality of mirrors. The FIG. 1D illustrates the synchronistical movements of the mirrors in the horizontal or transverse direction. The another type of mirror scanner 100 will be described in detail below. With reference to FIG. 1D, another type of mirror scanner 100 includes six mirrors 112, 114, 116, 118, 120 and 122. Laser beam from the source 1 strikes mirror 112, and is reflected in the upward direction to reach mirror 114, as shown in FIG. 1C. Mirror 114 then reflects laser beam in a path parallel to the axis to mirror 116. Referring again to FIG. 1D, the laser beam is transversely reflected by mirror 116 to mirror 118.

The mirrors 118, 120 and 122 are capable of synchronistically moving in the transverse direction, so that the optical path can be transversely altered to a parallel path, as the solid line and the dotted line in FIG. 1D show. The laser beam is also capable of being altered normally, by means of normal movement of mirror 122, as the dotted line and the solid line in FIG. 1C show. Therefore, the output laser beam from another type of mirror scanner 100 can also linearly scan the entire surface of the target 5, as illustrated in FIG. 1B. The synchronistical movements of mirrors 118, 120 and 122 for altering laser beam are accomplished by the moving means attached to mirrors, as follows. As shown in FIG. 1D, mirror 118 was supported by support bar 132. Support bar 132 was connected to servomotor 134 which includes a controller. Thus, servomotor 134 provides transverse movements to mirror 118 to alter the laser beam. Similar mechanisms are provided to either mirrors 120 and 122 (not shown). Therefore, these moving means give synchronistical movements of mirrors 118, 120 and 122.

Another type of mirror scanner 100 also comprises a mirror control system including servomotors for mirrors 118, 120 and 122, that allows horizontal or transverse movements of the mirrors described above (servomotors not shown).

As target 5 is heated by irradiation of laser beam, target material is vaporized and activated to form a flame-shaped "plume" (plasma) over target 5, as shown in FIG. 1A.

Substrate 6 is positioned to be generally perpendicular to target 5 (off-axis deposition geometry), and also rotate as shown in FIG. 1A, so that the entire surface of the substrate can contact with the apex of the plume from the target. In other words, the apex of the plume can contact across the entire surface of the substrate by the rotation of substrate 6. Therefore, the superconducting material layer can be formed with uniform layer thickness and uniform film quality across the entire surface of the substrate.

The off-axis geometry can be defined in another expression as follows. The plume is formed having an axis which is generally perpendicular to the target surface, as shown in FIG. 1A. The off-axis geometry is that the substrate surface to be deposited is generally parallel to the axis of the plume. By the term "generally parallel" in connection with determining the off-axis geometry, it is meant that the angle of the axis of the plume with the surface of substrate 6 is $-°$ (degrees) to 20° (degrees) (0°±20°). It is preferable that the angle between the plume axis and the substrate surface may be $-10°$ to 10° (0°± °), and more preferably the angle may be $-5°$ to 5° (0°±5°). The present invention provides the optimum chamber pressures for off-axis geometry laser ablation. The optimum chamber pressures have found for $Y_{b2}Cu_3O_{7-x}$ film, $CeO_2$ film and $SrTiO_3$ film, respectively.

The determined optimum chamber pressures of the present invention present excellent quality of stoichiometric film of the complex oxide superconducting compounds. The films formed under these optimum chamber pressures have almost no particles on their surface, and have fine surfaces.

In addition, substrate holder 46 further comprises a heating means (not shown), which heats substrate 6 to a desired temperature.

EXAMPLE

Examples 1 to 4 were conducted for the purpose of providing optimum chamber pressures for depositing $Y_1Ba_2Cu_3O_{7-x}$ film, $CeO_2$ film and $SrTiO_3$ film, respectively, according to the present invention. Examples 5 to 9 were for showing that the off-axis laser ablation according to the present invention is suitable for depositing large area films.

(Example 1)

The substrate processing apparatus shown in FIG. 1A was employed for the deposition of $Y_1Ba_3Cu_2O_{7-x}$ onto a $SrTiO_3$ substrate, according to the present invention. The optimum chamber pressure for obtaining optimal quality of $Y_1Ba_3Cu_3O_{7-x}$ film was presented in the instant example. A sintered $Y_1Ba_0Cu_2O_{7-x}$ disc having diameter of 15 mm was employed for target 5. The $SrTiO_3$ substrate was 20 mm square plate.

Seven experiments were conducted with seven different chamber pressures to find out optimum chamber pressure. Each experiment of the first example of the present invention was carried out under the chamber pressure of: 0.1 Torr (experiment 1-1), 0.4 Torr (experiment 1-4); 1.2 Torr (experiment 1-5), 1.5 Torr (experiment 1-6) and 2.0 Torr (experiment 1-7). All the experiments were conducted under the laser ablation conditions shown in Table 1. Only the chamber pressure was different among all the experiments of the present example.

TABLE 1

PROCESS CONDITION EXAMPLE 1

| Experiment No. | *¹chamber pressure |
| --- | --- |
| 1-1 | 0.1 Torr |
| 1-2 | 0.4 Torr |
| 1-3 | 0.8 Torr |
| 1-4 | 1.0 Torr |
| 1-5 | 1.2 Torr |
| 1-6 | 1.5 Torr |
| 1-7 | 2.0 Torr |

Figure 9:
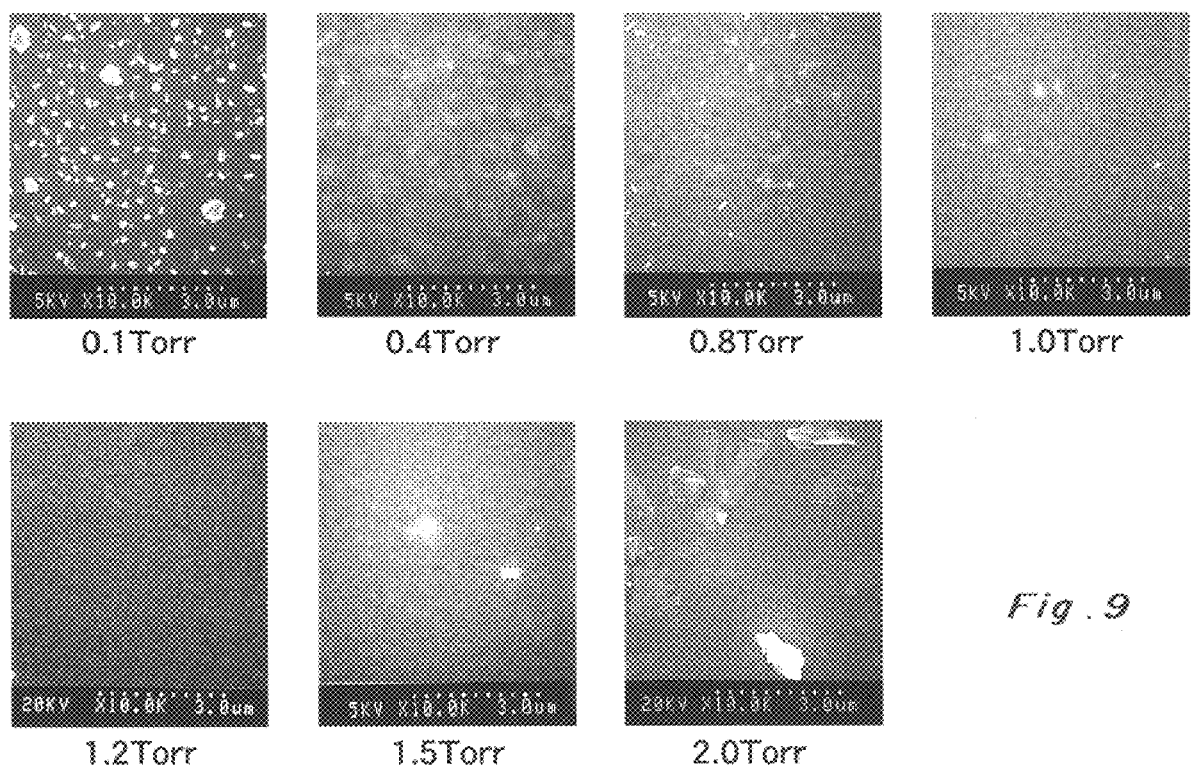
FIG. 9 comprises 7 SEM photographs obtained in experiment 1-1 to 1-7 of Example 1, showing surfaces of formed $Y_1Ba_CCu_3O_{7-x}$ film at different chamber pressures.

*¹The chamber pressure is also used to indicate the corresponding SEM photograph for the corresponding experiment in FIG. 9.

Other process conditions than chamber pressure were set as described below in all experiments of example 1;

| substrate surface temperature | 680° C. |
| --- | --- |
| distance from substrate center to target | 90 mm |
| laser wavelength | 248 nm |
| laser energy on target surface | 330 mJ/pulse |
| laser pulse frequency | 10 Hz |
| deposition time | 5 min. |
| resultant film thickness | 200 nm. |

Prior to processing, $Y_1Ba_2Cu_3O_{7-x}$ target 5 was placed onto target holder 45, and $SrTiO_3$ substrate 6 was placed onto substrate holder 46, as shown in FIG. 1A. Chamber 40 was evacuated to the pressure of $1\times10^{-6}$ Torr. $O_2$ gas was then introduced into the evacuated chamber 40 to give the predetermined chamber pressure corresponding to each experiment. Laser beam source of the present example was a KrF excimer laser having a wavelength of 240 nm. Target 5 was rotated by rotor 47 at a rotating rate of about 20 r.p.m. Substrate 6 also was rotated by rotor 48 at about 70 r.p.m.

Laser beam was traversed from laser beam source 1, through mirror scanner 100, lens 3 and first entrance window 11, to target 5, as shown in FIG. 1A, and target material was vaporized to form a plume. Mirror scanner 100 altered laser beam to scan target 5. Lens 3 moved correspondingly to the altering of laser beam by mirror scanner 100, so that the focusing of laser beam on target 5 was maintained to be constant. The corresponding movements of lens 3 was controlled by external controller (not shown). Thus the target was uniformly consumed across the target surface.

Vaporized target material was deposited onto the exposed surface of the substrate 6 which was disposed in off-axis geometry against target 5. After the processing ran for 5 min. of deposition time, the power supplying to laser beam source 1 was stopped and the experiment was completed.

The surfaces of deposited stoichiometric $Y_1Ba_2Cu_3O_{7-x}$ films were observed via Scanning Electron Microscope (SEM). SEM photographs of surfaces of $Y_1Ba_2Cu_3O_{7-x}$ films obtained in each experiments are shown in FIG. 9, which consists of seven SEM photographs. Each of the photographs included in FIG. 9 corresponds to each of the experiments, as indicated by the chamber pressure. For example, a photograph indicated "0.1 Torr" under the photograph is a SEM photograph of the surface of the $Y_1Ba_2Cu_3O_{7-x}$ film obtained in the experiment 1-1.

As shown in all the seven photographs in FIG. 9, excellent smoothness of the deposited $Y_1Ba_2C_3O_{7-x}$ films was obtained in experiments 1-3, 1-4, 1-5 and 1-6, which correspond to the chamber pressure ranging 0.8 Torr–1.5 Torr. In particular, no outgrowths and no particles were observed on the smooth surface obtained in experiment 1-5 (chamber pressure: 1.2 Torr).

(Example 2)

The second example was conducted, for the purpose of obtaining optimum chamber pressure when a $SrTiO_3$ film is deposited over the $Y_1Ba_2Cu_3O_{7-x}$ film by laser ablation according to the present invention. The experiments were carried out by depositing $SrTiO_3$ film over $Y_1Ba_2Cu_3O_{7-x}$ film which was formed onto the $SrTiO_3$ substrate in the experiments of the Example 1.

The process conditions of the second example are shown in Table 2. Five experiments were carried out with five different chamber pressures, 0.1, 0.15, 0.2, 0.3 and 0.4 Torr, as described in Table 2.

TABLE 2

PROCESS CONDITION  EXAMPLE 2

| Experiment No. | *²Chamber pressure |
| --- | --- |
| 2-1 | 0.1 Torr |
| 2-2 | 0.15 Torr |
| 2-3 | 0.2 Torr |
| 2-4 | 0,3 Torr |
| 2-5 | 0.4 Torr |

Figure 10:
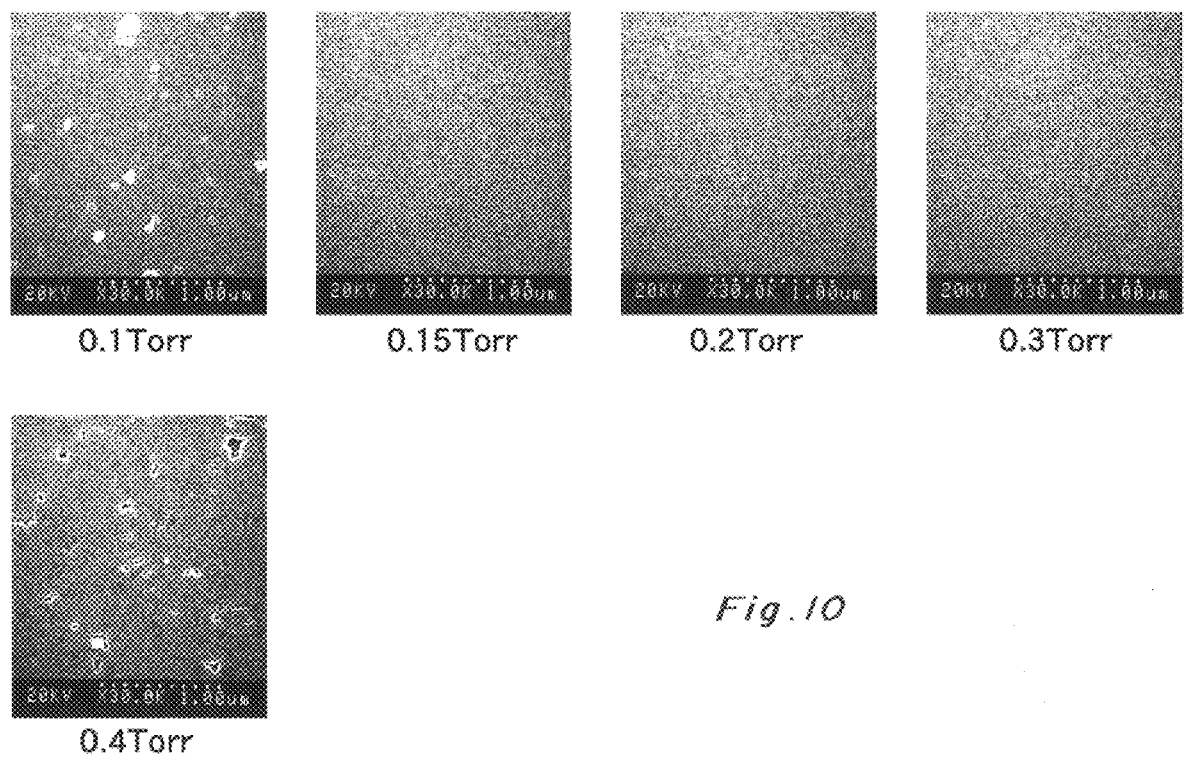
FIG. 10 comprises 5 SEM photographs obtained in experiment 2-1 to 2-5 of Example 2, showing surfaces of formed $SrTiO_3$ film at different chamber pressures.

*²The chamber pressure is also used to indicate the corresponding SEM photograph for the corresponding experiment in FIG. 10.

Other process conditions than chamber pressure were set as described below in all experiments of example 2;

| | |
| --- | --- |
| substrate surface temperature | 680° C. |
| distance from substrate center to target | 90 nm |
| laser wavelength | 248 nm |
| laser energy on target surface | 220 mJ/pulse |
| laser pules frequency | 10 Hz |
| deposition time | 5 min. |
| resultant film thichness | 100 nm. |

Target 5 used in the second example was a sintered $SrTiO_3$ disc having diameter of 15 mm. As in Example 1, $SrTiO_3$ target 5 was placed onto target holder 45, and $SrTiO_3$ substrates 6 having $Y_1Ba_2Cu_3O_{7-x}$ film thereon was placed onto substrate holder 46, as shown in FIG. 1A. The substrate 6 used in the Example 2 was the substrate obtained in the Example 1. Chamber 40 was evacuated to the pressure of $1 \times 10^{-6}$ Torr. $O_2$ gas was then introduced into the evacuated chamber 40 to give the predetermined chamber pressure corresponding to each experiment. Laser beam source of the present example was a KrF excimer laser having a wavelength of 248 nm. Target 5 and substrate 6 were rotated as in Example 1.

The surfaces of deposited $SrTiO_3$ films were observed via SEM, as in the first example. SEM photographs of surfaces of $SrTiO_3$ film formed over $Y_1Ba_2Cu_3O_{7-x}$ film in each experiment are shown in FIG. 10, which consists of five SEM photographs. Each of the five photographs included in FIG. 10 corresponds to each of the experiments with the indication by the chamber pressure, as in FIG. 10.

As shown in all the five photographs in FIG. 10, excellent smoothness of the deposited $SrTiO_3$ films was obtained, as well as no outgrowths and no particles were observed, in experiments 2-2, 2-3 and 2-4, which correspond to the chamber pressure ranging 0.15 Torr–0.3 Torr.

(Example 3)

The third example was conducted, for the purpose of finding out the optimum chamber pressure for depositing a $CeO_2$ film on an $Al_3O_2$ substrate by laser ablation according to the present invention.

A sintered $CeO_2$ disc having diameter of 15 mm was used as target 5 in the third example, and 20 mm square plate consisting of $Al_2O_3$ was employed for substrate 6, as shown in FIG. 1A.

The process conditions of the second example are shown in Table 3. In the third example, six experiments were carried out with six different chamber pressures, 0.01, 0.03, 0.05, 0.07, 0.1 and 0.4 Torr, as described in Table 3.

Chamber 40 was evacuated to the pressure of $10^{-6}$ Torr, and then $O_2$ gas was introduced through gas inlet 43 into chamber 40 to the pressure corresponding to experiment. Laser beam source of the present example was a KrF excimer laser having a wavelength of 248 nm. Target 5 and substrate 6 were rotated as in Example 1.

Figure 11:
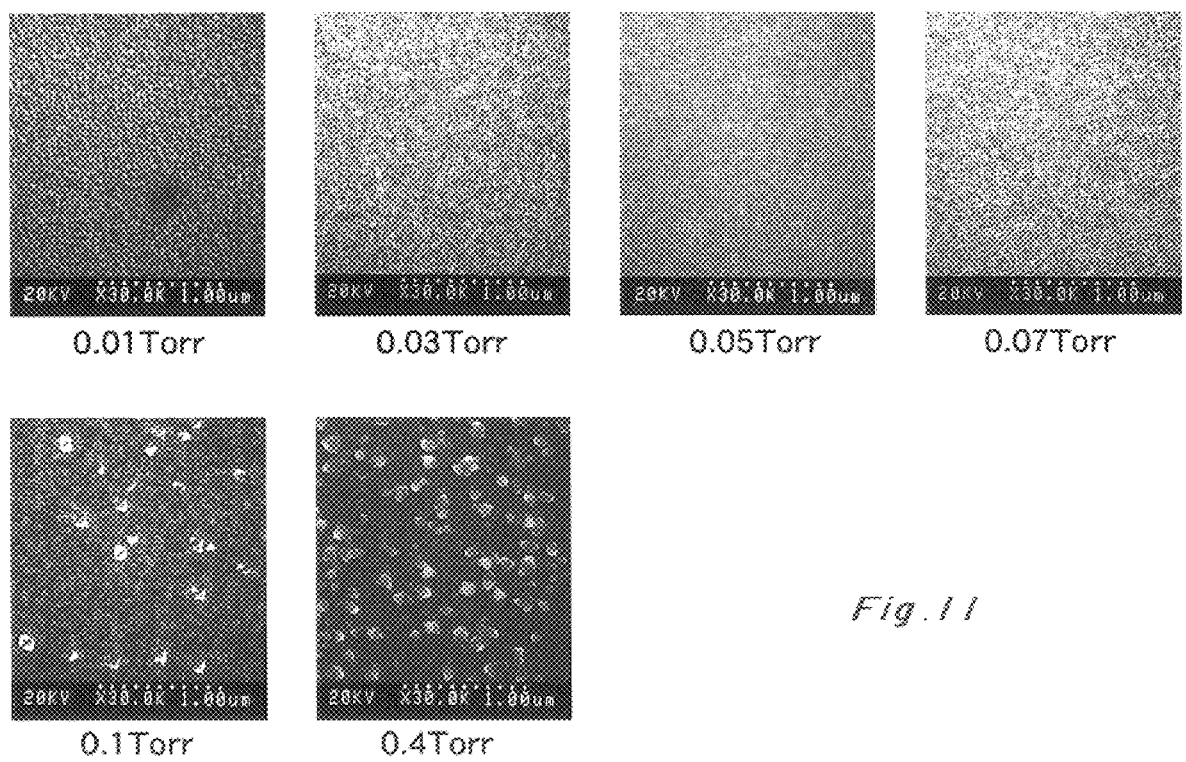
FIG. 11 comprises 6 SEM photographs obtained in experiment 3-1 to 3-6 of Example 3, showing surfaces of formed $CeO_2$ film at different chamber pressures.

The surfaces of deposited $CeO_2$ films were observed via SEM, as in Example 1. SEM photographs of the deposited $CeO_2$ surfaces in each experiment are shown in FIG. 11, which consists of six SEM photographs. Each of the six photographs included in FIG. 11 corresponds to each of the experiments with the indication by the chamber pressure, as in FIG. 11.

As shown in all the six photographs in FIG. 11, smooth and fine surfaces of the deposited $CeO_2$ films were obtained, as well as no outgrowths and no particles were observed, in experiments 3-2, 3-3 and 3-4, which correspond to the chamber pressure ranging 0.03 Torr–0.07 Torr.

TABLE 3

PROCESS CONDITION  EXAMPLE 3

| Experiment No. | *³Chamber pressure |
| --- | --- |
| 3-1 | 0.01 Torr |
| 3-2 | 0.03 Torr |
| 3-3 | 0.05 Torr |
| 3 4 | 0.07 Torr |
| 3-5 | 0.1 Torr |
| 3-6 | 0.4 Torr |

*³The chamber pressure is also used to indicate the corresponding SEM photograph for the corresponding experiment in FIG. 11.

Other process conditions than chamber pressure were set as described below in all experiments of example 3;

| | |
| --- | --- |
| substrate surface temperature | 680° C. |
| distance from substrate center to target | 90 mm |
| laser wavelength | 248 nm |
| laser energy on target surface | 330 mJ/pulse |
| laser pulse frequency | 10 Hz |
| deposition time | 5 min. |
| resultant film thickness | 50 nm. |

(Example 4)

$CeO_2$ film, $Y_1Ba_2Cu_3O_{7-x}$ superconducting film and $SrTiO_3$ film, in turn, were formed over $Al_2O_3$ substrate in the fourth example. The processing apparatus shown in FIGS. 1A, 1B, 1C and 1D were used for the present example, as in Examples 1–3.

The fourth example were carried out by three deposition steps: the first step (a) depositing a $CeO_2$ film on the $Al_2O_3$ substrate, the second step (b) depositing a $Y_1Ba_2Cu_3O_{7-x}$ superconducting film on the $CeO_3$ film, and the third step (c) depositing $SrTiO_3$ film on the $Y_1Ba_2Cu_3O_{7-x}$ superconducting film.

((a) depositing a $CeO_2$ film on the $Al_2O_3$ substrate.)

A sintered $CeO_2$ disc 5 having diameter of 15 mm was placed on target holder 45, and 20 mm square plate of $Al_2O_3$ 6 was placed on substrate holder 16, as shown in FIG. 1A. Substrate 6 was therefore disposed to form off-axis geometry against target 5, as illustrated in FIG. 1A, so that the surface of substrate to be deposited was generally parallel to the axis of the plume formed on the surface of $CeO_2$ target 5.

Chamber 40 was evacuated to the pressure of $10^{-6}$ Torr, and then $O_2$ gas was introduced through gas inlet 43 into chamber 40 to give the chamber pressure of 0.05 Torr. Laser beam source of the present example was a KrF excimer laser having a wavelength of 248 nm. Target 5 and substrate 6 were rotated as in Example 1 3. The depositing condition for $CeO_2$ film on $Al_2O_3$ substrate was shown in Table 4. Smooth and fine surface of $CeO_2$ was obtained in the deposition step of $CeO_2$ film in the present example.

TABLE 4

PROCESS CONDITION DEPOSITING $CeO_2$ FILM ON $Al_2O_3$ SUBSTRATE IN EXAMPLE 4

| | |
|---|---|
| substrate surface temperature | 680° C. |
| distance from substrate center to target | 90 mm |
| laser wavelength | 248 nm |
| laser energy on target surface | 330 mJ/pulse |
| laser pulse frequency | 10 Hz |
| deposition time | 2 min. |
| resultant $CeO_2$ film thickness | 20 nm. |

TABLE 5

PROCESS CONDITION DEPOSITING $Y_1Ba_2Cu_3O_{7-x}$ SUPERCONDUCTING FILM ON $CeO_2$ FILM IN EXAMPLE 4

| | |
|---|---|
| substrate surface temperature | 680° C. |
| distance from substrate center to target | 90 mm |
| laser wavelength | 248 nm |
| laser energy on target surface | 330 mJ/pulse |
| laser pulse frequency | 10 Hz |
| deposition Lime | 5 min. |
| resultant $Y_1Ba_2Cu_3O_{7-x}$ film thickness | 20 nm. |

((b) depositing a $Y_1Ba_2Cu_3O_{7-x}$ superconducting film on the $CeO_2$ film)

Then a $Y_1Ba_2Cu_3O_{7-x}$ superconducting film was deposited on the $CeO_2$ film which had been formed in the deposition step (a) of the present example.

A sintered $Y_1Ba_2Cu_3O_{7-x}$ disc having 15 mm diameter was taken place of the sintered $CeO_2$ disc using a multi-target holder (not shown). The $Y_1Ba_2Cu_3O_{7-x}$ disc was used as target 5 for the second deposition step (b) of the present example. The $Al_2O_3$ substrate 6 having $CeO_3$ film on its surface still remained on substrate holder 46. Therefore, substrate 6 was maintained to be off-axis geometry with $Y_1Ba_2Cu_3O_{7-x}$ target 5.

Then $O_2$ gas was introduced through gas inlet 43 into chamber 40 to give the chamber pressure of 1.0 Torr. Laser beam was introduced on $Y_1Ba_2Cu_3O_{7-x}$ target 5 to form plume over target 5, as shown in FIG. 1A.

Figure 12:
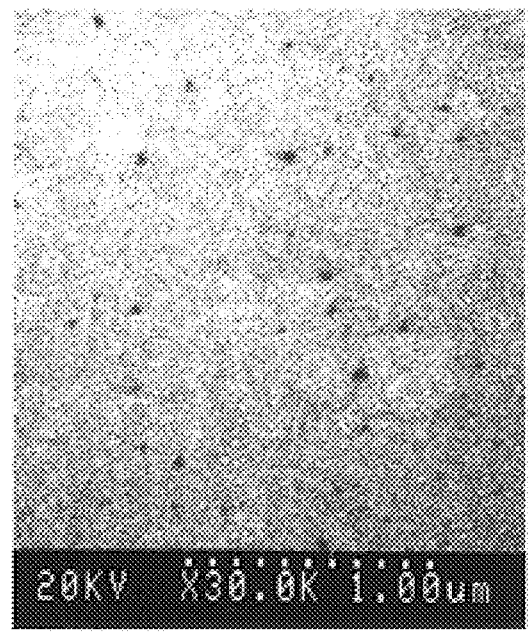
FIG. 12 is a SEM photograph showing the surface of formed $Y_1Ba_2Cu_3O_{7-x}$ film in Example 4.

After the deposition process continued for five minutes, stoichiometric $Y_1Ba_2Cu_3O_{7-x}$ film was formed. The resultant $Y_1Ba_2Cu_3O_{7-x}$ superconducting film was observed by SEM, and the SEM photograph is presented in FIG. 12. As shown in SEM photograph of FIG. 12, the smooth and fine surface was obtained in the second deposition step (b) of the fourth example. Almost the same smooth surfaces were obtained when the gas pressure was changed from 0.8 Torr to 1.5 Torr. The interface of the $Y_1Ba_2Cu_3O_{7-x}$ superconducting film with the $CeO_2$ film was distinctly formed, and the mutual diffusion between the $Y_1Ba_2Cu_3O_{7-x}$ superconducting film and the $CeO_2$ film was not observed.

((c) depositing $SrTiO_3$ film on the $Y_1Ba_2Cu_3O_{7-x}$ superconducting film)

Then, $SrTiO_3$ film was deposited on the $Y_1Ba_2Cu_3O_{7-x}$ superconducting film, which was formed in the second depositing step (b) of the present example.

$Y_1Ba_2Cu_3O_{7-x}$ target 5 was replaced to $SrTiO_3$ target 5, which was a 20 mm $SrTiO_3$ disc, by using the multi-target holder. The $Al_2O_3$ substrate 6 further having $CeO_2$ film on its surface still remained on substrate holder 46, maintaining the off-axis geometry against $SrTiO_3$ target 5.

Again, $O_2$ gas was introduced into Chamber 40 through gas inlet 43 to give the chamber pressure of 0.2 Torr. Laser beam was introduced on $SrTiO_3$ target 5 to form plume over target 5, as shown in FIG. 1A.

The depositing condition for $SrTiO_3$ film was described in Table 6.

TABLE 6

PROCESS CONDITION DEPOSITING $SrTiO_3$ FILM ON $Y_1Ba_2Cu_3O7x$ FILM IN EXAMPLE 4

| | |
|---|---|
| substrate surface temperature | 680° C. |
| distance from substrate center to target | 90 mm |
| laser wavelength | 248 nm |
| laser energy on target surface | 220 mJ/pulse |
| laser pulse frequency | 10 Hz |
| deposition time | 5 min. |
| resultant $SrTiO_3$ film thickness | 100 nm. |

Figure 13:
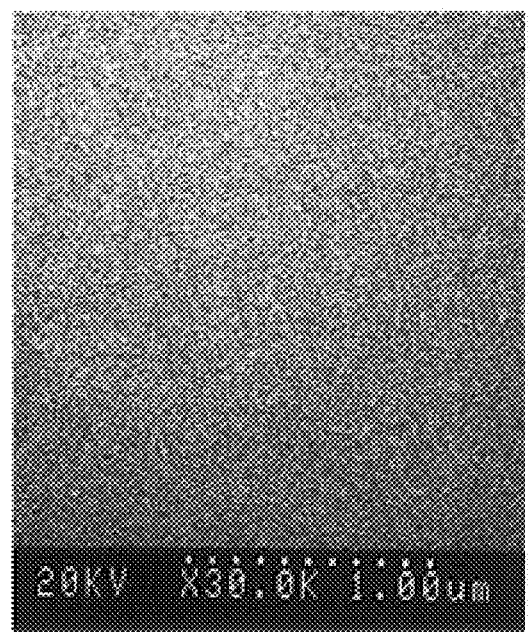
FIG. 13 is a SEM photograph showing the surface of formed $SrTiO_2$ film in Example 4.

After five minute-long deposition process, $SrTiO_3$ film was formed on the $Y_1Ba_2Cu_3O_{7-x}$ superconducting film. The resultant $SrTiO_3$ film was observed by SEM, and the SEM photograph of the surface of $SrTiO_3$ film is presented in FIG. 13. As shown in SEM photograph of FIG. 13, the smooth and fine surface was obtained in the third deposition step (c) of the fourth example. Almost the same smooth surfaces were obtained when the gas pressure changed from 0.15 Torr to 0.3 Torr. It was also observed by SEM that the interface of the $SrTiO_3$ film with the $Y_1Ba_2Cu_3O_{7-x}$ superconducting film was distinctly formed, and the mutual diffusion between the $SrTiO_3$ film and the $Y_1Ba_2Cu_3O_{7-x}$ superconducting film was not observed.

(Example 5)

The fifth example according to the present invention was conducted, for the purpose of presenting that the present invention is suitable for depositing large area $Y_1Ba_2Cu_3O_{7-x}$ superconducting films on large area. $Y_1Ba_2Cu_3O_{7-x}$ amorphous films were formed on entire surface of Si substrate, according to the present invention. Further, the conventional laser ablation depositions were also carried out, for the comparison between the present invention and the conventional method. In the conventional methods, the target rotated, but scanning of laser beam on the target was not made.

The laser ablation apparatus shown in FIGS. 1A, 1B and 1C or 1D was used for the present example. A single crystalline Si wafer having a size of 76 mm in diameter and 0.4 mm in thickness was used for substrate 6. A $Y_1Ba_2Cu_3O_{7-x}$ disc having a size of 76 mm in diameter and 5 mm in thickness was used for target 5.

Prior to processing, $Y_1Ba_2Cu_2O_{7-x}$ target 5 was placed onto target holder 45, and Si substrate 6 was placed onto substrate holder 46, as shown in FIG. 1A. The configuration of target 5 and substrate 6 is also shown in FIG. 2A, front view, and 2B, a side view.

Chamber 40 was evacuated to the pressure of $1 \times 10^{-6}$ Torr. $O_2$ gas was then introduced into the evacuated chamber 40 to give the chamber pressure of 1.0 Torr. Another chamber pressure of 1.2 Torr was also used to provide similar result. Laser beam source of the present example was a KrF excimer laser having a wavelength of 248 nm. The process condition was shown in Table 7.

TABLE 7

PROCESS CONDITION: EXAMPLE 5

| | |
|---|---|
| Experiment (i) | the conventional laser ablation. Laser beam does not scan. Only the target rotates. The substrate stops. |
| Experiment (ii) | the conventional laser ablation. Laser beam does not scan. Both the target and the substrate rotate. |
| Experiment (iii) | the present invention. Laser beam scans on target surface. Both the target and the substrate rotate. |
| Process condition for experiment (i), (ii) and (iii) | |
| substrate surface temperature | 300° C. |
| distance from substrate center to target | 90 mm |
| chamber pressure (O$_2$ pressure) | 1.0–1.2 Torr |
| laser wavelength | 248 nm |
| laser energy on target surface | 330 mJ/pulse |
| laser irradiation area on target | 4 × 1 mm$^2$ |
| laser pulse frequency | 10 Hz |
| rotation rate of target | 20 rpm. |
| rotation rate of substrate | 72 rpm.(*a) |
| deposition time | 5 min. |

According to the present invention, laser beam was traversed from laser beam source 1, through mirror scanner 100, lens 3 and first entrance window 11, to target 5, as shown in FIG. 1A, and target material was vaporized to form plume. Mirror scanner 100 oscillated the laser beam to scan target 5. Lens 3 moved corresponding to the oscillation of laser beam by mirror scanner 100, so that the focusing of laser beam on target 5 was maintained to be constant, as shown in FIG. 1B. The corresponding movements of lens 3 was controlled by controller. Thus the target was uniformly consumed across the target surface.

The scanning on target 6 was carried out, as shown in FIG. 1B, in the following manner; laser beam linearly scans the surface of target 5 from the vicinity of one edge of target 5 to the vicinity of another edge along the diameter of Y$_1$Ba$_2$Cu$_3$O$_{7-x}$ disc 5 at a scanning rate (linear velocity of laser beam scanning) of 1.9 mm/sec. The distance for the linear scanning along the target diameter was 72 mm. During the scanning, laser beam makes stops at each scanning edge for 4 secs., and also stops for 0.4 sec. at the two points where the distance from the nearest edge is 20 mm and 30 mm, respectively.

Three experiments, an experiment (iii) according to the present invention and the other experiments (i) and (ii) according to the conventional method for comparison, were carried out as mentioned above. Vaporized target material was deposited onto the exposed surface of the substrate 6 which was disposed in off-axis geometry against target 5. After the processing ran for 5 min. of deposition time, the power supplying to laser beam source 1 was stopped and the experiment was completed.

Figure 3A:
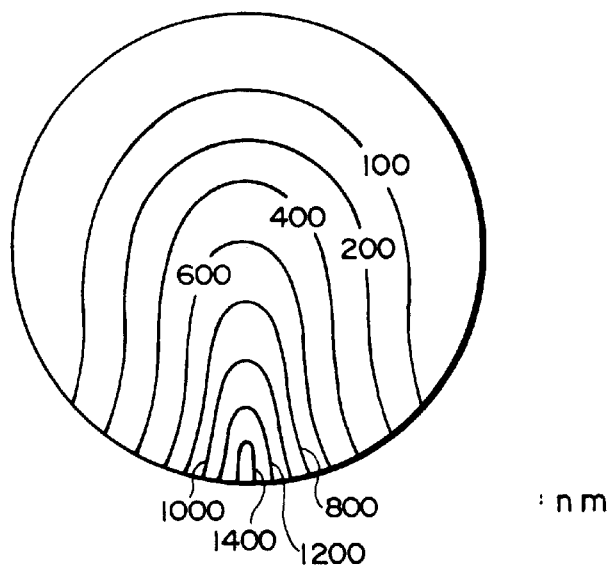
FIG. 3A shows a thickness distribution of $Y_1Ba_2Cu_3O_{7-x}$ film formed in the experiment (i) of Example 5 according to the conventional method.
Figure 3B:
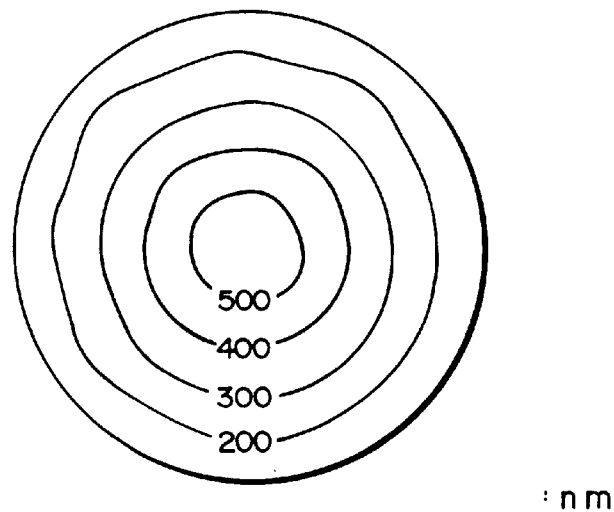
FIG. 3B shows a thickness distribution of $Y_1Ba_2Cu_3O_{7-x}$ film formed in the experiment (ii) of Example 5 according to the conventional method.
Figure 3C:
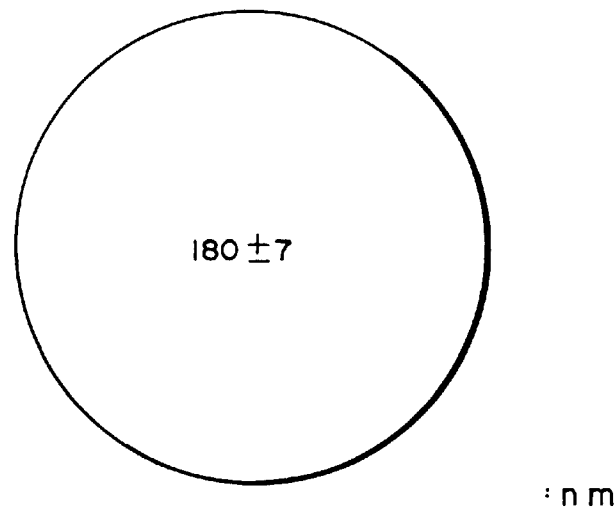
FIG. 3C shows a thickness distribution of $Y_1Ba_2Cu_3O_{7-x}$ film formed in the experiment (iii) of Example 5 according to the present invention.

Thickness distributions of the deposited Y$_1$Ba$_2$Cu$_3$O$_{7-x}$ films were measured, and the results are shown in FIGS. 3A, 3B and 3C. FIG. 3A shows thickness distribution of the film obtained in experiment (i), FIG. 3B is for experiment (ii), and FIG. 3C is for experiment (iii). As shown in FIG. 3A, the conventional method, in which only target rotates and no laser scanning is made, provides considerable thickness distribution from 100 nm to 1400 mm. FIG. 3B indicates that the conventional experiment (ii), in which both the target and the substrate rotate but no scanning is made, gives large thickness distribution of 200 mm–500 mm.

As shown in FIG. 3C, the experiment (iii) according to the present invention gives excellent uniformity in film thickness and excellent surface smoothness. The thickness distribution of the deposited film was from 173 m to 187 mm. Consequently, the scanning of laser beam and the rotation of the substrate are effective to achieve excellent film thickness uniformity.

(Example 6)

In the sixth example of the present invention, a large area Y$_1$Ba$_2$Cu$_3$O$_{7-x}$ superconducting film was deposited on a large area LaAlO$_3$ substrate.

The laser ablation apparatus shown in FIGS. 1A, 1B and 1C or 1D was used for the present example. A single crystalline LaAlO$_3$ disc having a size of 76 mm in diameter and 0.5 mm in thickness was used for substrate 6. A Y$_1$Ba$_2$Cu$_3$O$_{7-x}$ disc having a size of 76 m in diameter and 5 mm in thickness was used for target 5.

The deposition process was carried out similarly as in experiment (iii) of Example 5. The process condition of the present example is shown in Table 8.

The scanning on target 5 was carried out similarly as in example 5, as shown in FIG. 1B, at a scanning rate of 1.9 mm/sec. The distance for the linear scanning along the target diameter was 72 mm. During the scanning, laser beam makes stops at each scanning edge for 4 secs., and also stops for 0.4 sec. at the two points where the distance from the nearest edge is 20 mm and 30 mm, respectively.

TABLE 8

PROCESS CONDITION FOR EXAMPLE 6

| | |
|---|---|
| substrate surface temperature | 650–690° C. |
| distance from substrate center to target | 90 mm |
| chamber pressure (O$_2$ pressure) | 1.0–1.2 Torr |
| laser wavelength | 248 nm |
| laser energy on target surface | 330 mJ/pulse |
| laser irradiation area on target | 4 × 1 mm$^2$ |
| laser pulse frequency | 30 Hz |
| rotation rate of target | 20 rpm. |
| rotation rate of substrate | 72 rpm.(*a) |
| deposition time | 10 min. |

Figure 4:
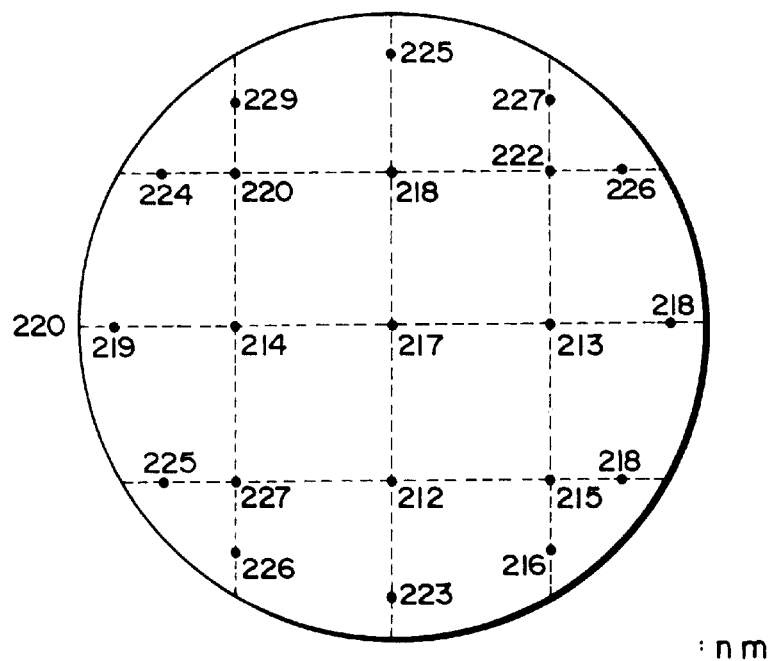
FIG. 4 shows a thickness distribution of $Y_1Ba_2Cu_3O_{7-x}$ film formed in Example 6.
Figure 5:
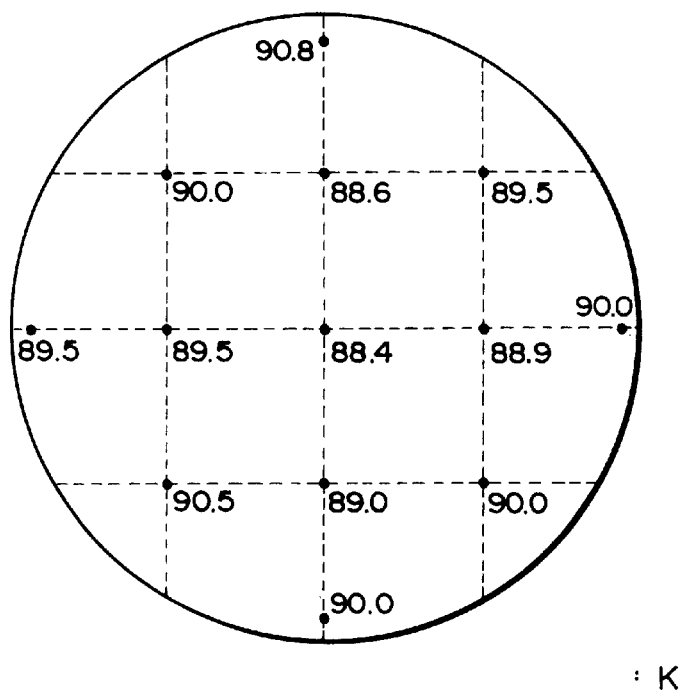
FIG. 5 shows a critical temperature distribution of $Y_1Ba_2Cu_3O_{7-x}$ film formed in Example 6.

Thickness distribution of the deposited film was measured. The measured thickness distribution is shown in FIG. 4. Further, the critical temperature of the deposited Y$_1$Ba$_2$Cu$_3$O$_{7-x}$ superconducting film was measured, and the critical temperature distribution of the deposited Y$_1$Ba$_2$Cu$_3$O$_{7-x}$ superconducting film is shown in FIG. 5.

As shown in FIG. 4, the excellent uniformity in film thickness were achieved. The thickness distribution of the deposited film was from 212 mm to 229 mm, or in other words about ±4% of the thickness distribution for a mean film thickness of about 220 mm was obtained. FIG. 5 shows that the excellent uniformity on film quality was obtained, as indicated in the narrower critical temperature distribution of from 88 k to 91 K.

(Example 7)

The seventh example of the present invention was carried out in similar manner as Example 6, with slightly different configuration of the substrate and the target. The processing condition of the seventh example was the same as in Example 6, thus described in Table 8, except the target-substrate configuration.

Figure 6A:
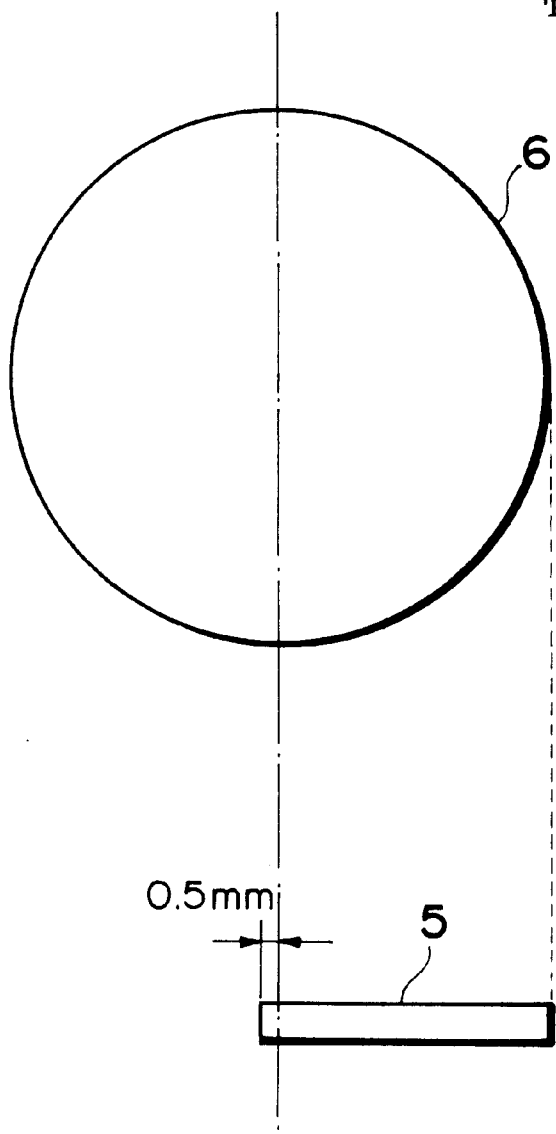
FIG. 6A shows a front view of a example of the off-axis geometry.
Figure 6B:
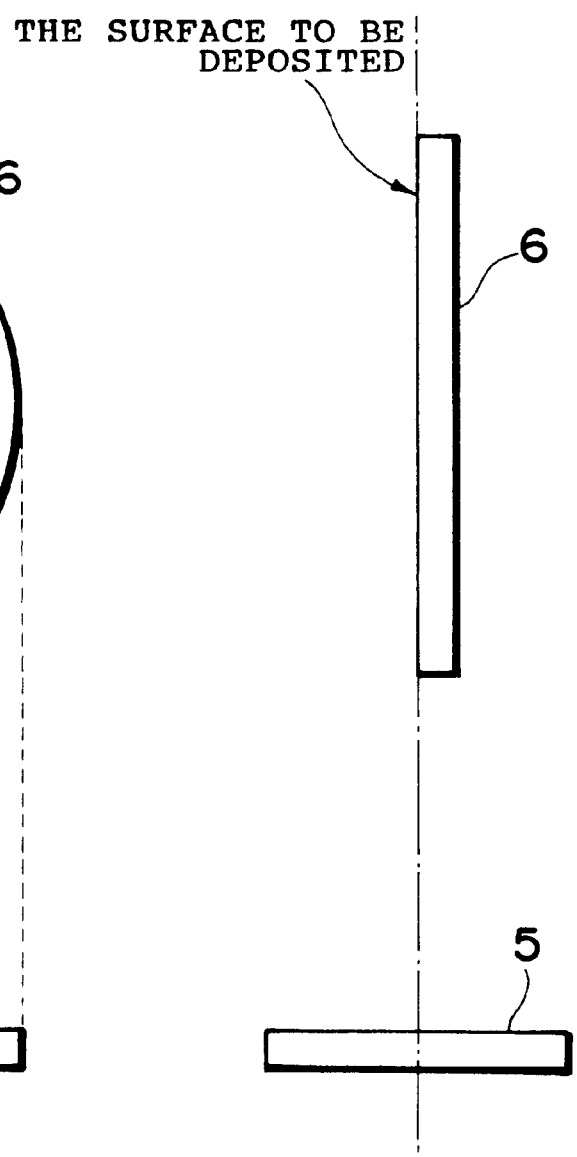
FIG. 6B shows a side view of a example of the off-axis geometry.

A single crystalline LeAlO$_3$ disc having a size of 75 mm in diameter and 0.5 mm in thickness was used for substrate 6. A Y$_1$Ba$_2$Cu$_3$O$_{7-x}$ disc having a size of 38 mm in diameter and 5 mm in thickness was used for target The target-substrate configuration of the seventh example is illustrated in FIG. 6A, a front view, and FIG. 6B, a side view. As shown in FIGS. 6A and 6B, the surface of substrate 6 to be deposited is generally perpendicular to the surface of target 5. Substrate is disposed so that the normal line of target 5 (indicated by alternate long and short dash line) is in parallel to and overlapping with the surface of substrate 6 to be deposited. Further, target 5 is selected so that the diameter of target 5 is more than a half of the diameter of substrate 6, and is placed so that the normal line of target 5 near the edge of target 5 passes the center of substrate 6. A preferable embodiment of the target-substrate configuration is shown in FIG. 6A, where the normal line of target 5, which is 0.5 mm apart from the edge of target 5, passes the center of substrate 6.

The scanning on target 5 was carried out similarly as in example 5, as shown in FIG. 1B, at a scanning rate of 1.9 mm/sec. The distance for the linear scanning along the target diameter was 36 mm. During the scanning, laser beam makes stops at each scanning edge, which corresponds to the substrate edge, for 4 secs., and also stops for 0.4 sec. at the two points corresponding to the substrate center, where the distance from the nearest edge is 6 mm and 16 mm, respectively.

Thickness distribution of the deposited film and the critical temperature of the deposited $Y_1Ba_2Cu_3O_{7-x}$ superconducting film were measured, and similar result as obtained in Example 6 was obtained. The thickness distribution ranging of about ±4% from a mean film thickness of about 220 mm was obtained. The critical temperature of the deposited $Y_1Ba_2Cu_3O_{7-x}$ film ranged from 88 K to 91 K in entire film surface.

(Example 8)

The eighth example of the present invention was carried out in similar manner as Example 6, with different laser beam scanning manner. The processing condition of the seventh example was the same as in Example 6, thus described in Table 8.

In the present example, the scanning on $Y_1Ba_2Cu_3O_{7-x}$ target 5 was carried out, as shown in FIG. 1B, in the following manner; laser beam linearly scans the surface of target 5 from the vicinity of one edge of target 5 to the vicinity of another edge along the diameter of $Y_1Ba_2Cu_3O_{7-x}$ disc 5. In this example, the scanning rate (linear velocity of laser beam scanning) was varied; scanning rate was maximized to be 25 mm/sec. at the center of target 5, and the scanning rate decreased along the scanning path. The scanning velocity was inversely proportional to a square of the distance from the rotation center of the target. The distance for the linear scanning along the target diameter was 71 mm. During the scanning, laser beam makes stops at each scanning edge for 0.1 secs.

Figure 7:
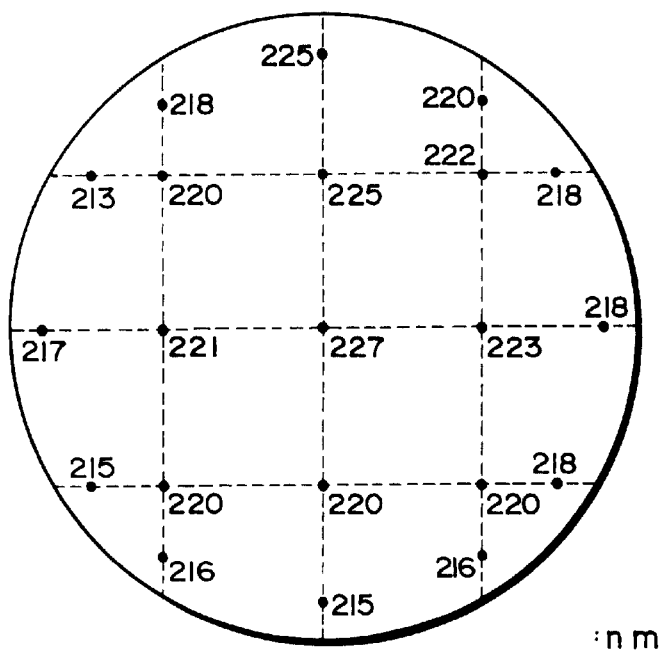
FIG. 7 shows a thickness distribution of $Y_1Ba_2Cu_3O_{7-x}$ film formed in Example 8.
Figure 8:
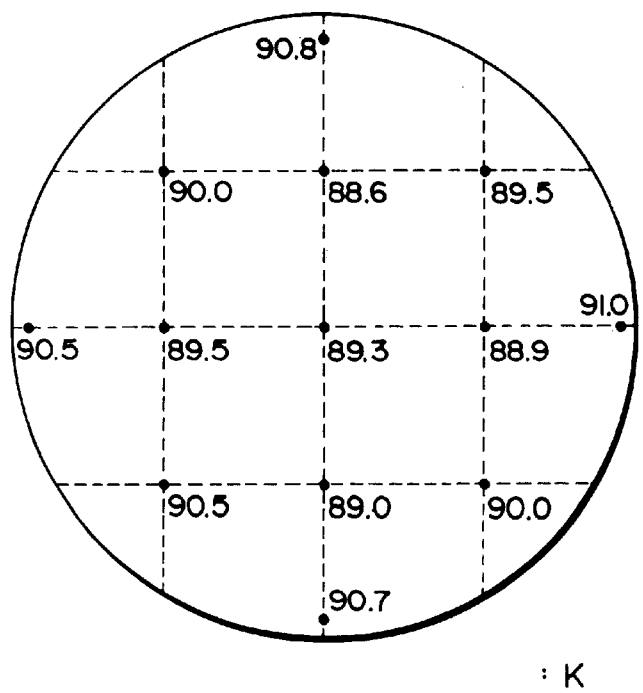
FIG. 8 shows a critical temperature distribution of $Y_1Ba_2Cu_3O_{7-x}$ film formed in Example 8.

Thickness distribution of the deposited film was measured and the obtained thickness distribution is shown in FIG. 7. The critical temperature of the deposited $Y_1Ba_2Cu_3O_{7-x}$ superconducting film was also measured, and the result is shown in FIG. 8. The thickness distribution ranging of about ±3% from a mean film thickness of about 220 mm was obtained. The critical temperature of the deposited $Y_1Ba_2Cu_3O_{7-x}$ film ranged from 88 k to 91 K in entire film surface.

(Example 9)

The ninth example of the present invention was carried out in similar manner as Example 7, with different laser beam scanning manner. The processing condition of the seventh example was the same as in Example 6, thus described in Table 8.

The target-substrate configuration of the ninth example is illustrated in FIG. 6A, a front view, and FIG. 6B, a side view, that is the same configuration as in Example 7.

In the present example, the scanning rate was varied; scanning rate was maximized to be 25 mm/sec. at the scanning edge of target 5, which corresponds to the substrate center, and the scanning rate decreased along the scanning path. The scanning velocity was inversely proportional to a square of the distance from the rotation center of the target. The distance for the linear scanning along the target diameter was 37 mm. During the scanning, laser beam makes stops at each scanning edge, which corresponds to the rotation center of the substrate, for 0.1 secs.

Thickness distribution of the deposited film was measured and the obtained thickness distribution is shown in FIG. 7. The critical temperature of the deposited $Y_1Ba_2Cu_3O_{7-x}$ superconducting film was also measured, and the result is shown in FIG. 8. The thickness distribution ranging of about ±3% from a mean film thickness of about 220 mm was obtained. The critical temperature of the deposited $Y_1Ba_2Cu_3O_{7-x}$ film ranged from 88 K to 91 K in entire film surface.

Although the present invention has been described in considerable detail with reference to certain preferred versions, many other versions should be apparent to those skilled in the art. For example, the target material may be selected from other complex superconducting oxides such as $T1Ba_2CaCu_2O_x$, $T1_2Ba_2Ca_2Cu_3O_x$, $Bi_2Sr_2CaCu_2O_x$ or $Bi_2Sr_2Ca_2Cu_3O_x$. Further, the substrate 6 may be $LaAlO_a$ having a (100) plane, sapphire ($Al_2O_3$) having a R plane or $SrTiO_3$. In addition, the laser beam source may be an ArF excimer laser having wavelength of 193 nm or XeCl excimer laser having wavelength of 308 nm.

Thus, such variations are not to be regarded as a departure from the spirit and scope of the invention, and all such modifications as would be obvious to one skilled in the art are intended for inclusion within the scope of the following claims.

The basic Japanese Application Nos. 248199/1994 (6-248499) filed on Sep. 16, 1994, and 248501/1994 (6-248501) filed on Sep. 16, 1994, are hereby incorporated by reference.

What is claimed is:

1. A method for forming superconducting films of complex oxide compounds in a process chamber, which comprises:

(a) placing a substrate at a location near a target in a chamber so that said substrate is positioned to be generally perpendicular to a surface of said target, said target comprising a target material of complex oxide compounds;

(b) irradiating a laser beam to said surface of said target to vaporize or sublime said target material thereby forming over said target a flame-shaped plume having an axis generally perpendicular to said surface of said target so that said target material is deposited onto a surface of said substrate;

(c) during said step (b), maintaining said substrate at said location such that a surface of said substrate is remote from said axis of said plume and generally perpendicular to said surface of said target;

whereby said substrate surface is generally parallel to said axis of said plume and a side of said plume contacts said surface of said substrate;

(d) during said step (b), rotating said target on an axis perpendicular to said surface of said target and rotating said substrate on an axis perpendicular to said surface of said substrate; and (e) during said step (b), scanning said laser beam over said surface of said target.

2. A method according to claim 1, wherein said laser beam scans by a mirror scanner which comprises a mirror capable of oscillating or swinging so that the path of the laser beam oscillates, and wherein said laser beam which strikes said target linearly traverses between one position near an edge and another position near the opposite edge.

3. A method according to claim 1, wherein said laser beam scans by a mirror scanner which comprises a plurality of mirrors, wherein said mirrors synchronistically move to alter the optical path of said laser beam so that the laser beam traverses said surface of said target.

4. A method according to claim 1, wherein said laser beam of said step (b) of irradiating a laser beam traverses along a path on said surface of said target of more than ½ of the representative length of said target.

5. A method according to claim 1, wherein said laser beam of said step (b) of irradiating a laser beam scans with a traversing rate which varies with the striking position of said surface of said target.

6. A method according to claim 5, wherein said traversing rate is maximum at a center of said target and smaller at positions other than said center of said target.

7. A method according to claim 5, wherein said laser beam makes temporary stops.

8. A method according to claim 1, wherein the diameter of said target is more than a half of the diameter of said substrate, and is placed so that the normal line of said target near the edge of said target passes the center of said substrate.

9. A method according to claim 1, wherein said target material is selected from the group consisting of $Y_1Ba_2Cu_3O_{7-x}$, $T1Ba_2CaCu_2O_x$, $T1_2Ba_2Ca_2Cu_3O_x$, $Bi_2Sr_2CaCu_2O_x$ and $Bi_2Sr_2Ca_2Cu_3O_x$.

10. A method according to claim 1, wherein said laser beam is selected from the group consisting of an ArF excimer laser having a wavelength of 93 nm, a KrF excimer laser having a wavelength of 248 nm and a XeCl excimer laser having a wavelength of 308 nm.

11. A method according to claim 1, wherein said axis of said plume and the surface of said substrate form an angle of −20 degrees to 20 degrees.

12. A method for forming superconducting films of $Y_1Ba_2Cu_3O_{7-x}$ in a process chamber, which comprises:

(a) placing a $Y_1Ba_2Cu_3O_{7-x}$ target in a chamber;

(b) placing a substrate near said $Y_1Ba_2Cu_3O_{7-x}$ target in said chamber so that said substrate is positioned to be generally perpendicular to a surface of said target, said target comprising a target material of $Y_1Ba_2Cu_3O_{7-x}$; and (c) irradiating a laser beam to the surface of said target to vaporize or sublime said target material forming over said target a flame-shaped plume having an axis generally perpendicular to the surface of said target so that said target material is deposited onto a surface of said substrate, the surface of said substrate maintaining the position to be generally perpendicular to the surface of said target and being generally parallel to said axis of the plume, wherein the pressure in said chamber $P_c$ is;

0.8 Torr$\leq P_c \leq$1.5 Torr.

13. A method for forming films of $SrTiO_3$ in a process chamber, which comprises:

(a) placing a $SrTiO_3$ target in a chamber;

(b) placing a substrate near said $SrTiO_3$ target in said chamber so that said substrate is positioned to be generally perpendicular to a surface of said target, said target comprising a target material of $SrTiO_3$; and (c) irradiating a laser beam to the surface of said target to vaporize or sublime said target material forming over said target a flame-shaped plume having an axis generally perpendicular to the surface of said target so that said target material is deposited onto a surface of said substrate, the surface of said substrate maintaining the position to be generally perpendicular to the surface of said target and being generally parallel to said axis of the plume, wherein the pressure in said chamber $P_c$ is;

0.15 Torr$\leq P_c \leq$0.3 Torr.

14. A method for forming films of $CeO_2$ in a process chamber, which comprises:

(a) placing a $CeO_2$ target in a chamber;

(b) placing a substrate near said $CeO_2$ target in said chamber so that said substrate is positioned to be generally perpendicular to a surface of said target, said target comprising a target material of $CeO_2$; and (c) irradiating a laser beam to the surface of said target to vaporize or sublime said target material forming over said target a flame-shaped plume having an axis generally perpendicular to the surface of said target so that said target material is deposited onto a surface of said substrate, the surface of said substrate maintaining the position to be generally perpendicular to the surface of said target and being generally parallel to said axis of the plume, wherein the pressure in said chamber $P_c$ is;

0.03 Torr$\leq P_c \leq$0.07 Torr.

15. A method for forming a $CeO_2$ film, a $Y_1Ba_2Cu_3O_{7-x}$ superconducting film, and a $SrTiO_3$ film in a process chamber, which comprises:

(a) placing a $CeO_2$ target in a chamber;

(b) placing a substrate near a $CeO_2$ target in a chamber so that said substrate is positioned to be generally perpendicular to a surface of said target, said target comprising a target material of $CeO_2$;

(c) irradiating a laser beam to the surface of said $CeO_2$ target to vaporize or sublime said target material forming over said target a flame-shaped plume having an axis generally perpendicular to the surface of said target so that said target material is deposited onto a surface of said substrate, the surface of said substrate maintaining the position to be generally perpendicular to the surface of said target and being generally parallel to said axis of the plume, wherein the pressure in said chamber $P_c$ is 0.03 Torr$\leq P_c \leq$0.07 Torr;

(d) replacing said $CeO_2$ target with a $Y_1Ba_2Cu_3O_{7-x}$ target, and irradiating a laser beam to the surface of said $Y_1Ba_2Cu_3O_{7-x}$ target to deposit a $Y_1Ba_2Cu_3O_{7-x}$ film on said $CeO_2$ film, the surface of said substrate maintaining the position to be generally perpendicular to the surface of said target and being generally parallel to said axis of the plume of $Y_1Ba_2Cu_3O_{7-x}$, wherein the pressure in said chamber $P_c$ is $0.8 \text{ Torr} \leq P_c \leq 1.5 \text{ Torr}$; and (e) replacing said $Y_1Ba_2Cu_3O_{7-x}$ target with a $SrTiO_2$ target, and irradiating a laser beam to the surface of said $SrTiO_3$ target to deposit a $SrTiO_3$ film on said $Y_1Ba_2Cu_3O_{7-x}$ film, the surface of said substrate maintaining the position to be generally perpendicular to the surface of said target and being generally parallel to said axis of the plume of $SrTiO_3$, wherein the pressure in said chamber $P_c$ is $0.15 \text{ Torr} \leq P_c \leq 0.3 \text{ Torr}$.

16. An apparatus for forming a film on a substrate by laser ablation processing, comprising:
(i) a chamber having an entrance window for introducing a laser beam into said chamber, a gas inlet through which gases are supplied into said chamber and a gas outlet through which gases are exhausted from said chamber;
(ii) a laser beam source which generates the laser beam in a way incident into said chamber via said entrance window;
(iii) a scanning means located between said laser beam source and said chamber, which alters a path of the laser beam;
(iv) a target support disposed in said chamber for supporting a target in said chamber, said target support connecting to a target rotor, wherein said target is irradiated by a laser beam from said laser beam source via said entrance window, and wherein said target rotor itself rotates to rotate said target on an axis perpendicular to the surface of said target;
(v) a substrate support disposed in said chamber for supporting a substrate in said chamber; and a substrate rotor connected to said substrate support for positioning a deposition surface of said substrate on which said film is deposited generally perpendicular to the surface of said target and generally parallel to a longitudinal axis of a plume produced by said target such that, while said target is irradiated by said laser beam, said deposition surface of said substrate is held remote from said longitudinal axis of said plume and said deposition surface contacts only a side of said plume, and wherein said substrate rotor itself rotates to rotate said substrate on an axis perpendicular to the surface of said substrate.

17. An apparatus according to claim 16, wherein said scanning means is a mirror scanner comprising a mirror capable of oscillating or swinging so that the path of the laser beam oscillates, wherein the laser beam which strikes said target linearly traverses between one position near an edge and another position near the opposite edge.

18. An apparatus according to claim 16, wherein said scanning means is a mirror scanner comprising a plurality of mirrors, said mirrors being capable of synchronistically moving so that the laser beam path is altered to a generally parallel path.

19. An apparatus according to claim 16, further comprising a lens for focusing the laser beam disposed between said scanning means and said entrance window, wherein said lens is capable of moving synchronistical to the scanning of laser beam.

* * * * *